(12) United States Patent
Eskridge

(10) Patent No.: US 8,531,040 B1
(45) Date of Patent: Sep. 10, 2013

(54) CONTROLLED AREA SOLDER BONDING FOR DIES

(75) Inventor: Mark Eskridge, Renton, WA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 13/419,779

(22) Filed: Mar. 14, 2012

(51) Int. Cl.
*H01L 23/48* (2006.01)
*H01L 23/52* (2006.01)
*H01L 29/40* (2006.01)
*H01L 21/44* (2006.01)

(52) U.S. Cl.
USPC .......... 257/779; 257/737; 257/738; 257/773; 438/612; 438/613

(58) Field of Classification Search
USPC ............... 257/779, 773, 737, 738; 438/612, 438/613
See application file for complete search history.

(56) References Cited

U.S. PATENT DOCUMENTS

| | | | | | |
|---|---|---|---|---|---|
| 5,056,215 | A | * | 10/1991 | Blanton | 29/840 |
| 5,326,428 | A | * | 7/1994 | Farnworth et al. | 324/724 |
| 5,400,950 | A | * | 3/1995 | Myers et al. | 228/180.22 |
| 5,523,697 | A | * | 6/1996 | Farnworth et al. | 324/754.2 |
| 5,736,790 | A | * | 4/1998 | Iyogi et al. | 257/780 |
| 5,929,521 | A | * | 7/1999 | Wark et al. | 257/737 |
| 5,968,670 | A | * | 10/1999 | Brofman et al. | 428/576 |
| 5,977,632 | A | * | 11/1999 | Beddingfield | 257/737 |
| 5,985,682 | A | * | 11/1999 | Higgins, III | 438/10 |
| 6,005,290 | A | * | 12/1999 | Akram et al. | 257/723 |
| 6,043,429 | A | * | 3/2000 | Blish et al. | 174/361 |
| 6,274,473 | B1 | * | 8/2001 | Blish et al. | 438/612 |
| 6,291,897 | B1 | * | 9/2001 | Wark et al. | 257/786 |
| 6,391,687 | B1 | * | 5/2002 | Cabahug et al. | 438/123 |
| 6,444,563 | B1 | * | 9/2002 | Potter et al. | 438/615 |
| 6,507,121 | B2 | * | 1/2003 | Huang | 257/780 |
| 6,559,527 | B2 | * | 5/2003 | Brofman et al. | 257/678 |
| 6,642,626 | B2 | * | 11/2003 | Park | 257/778 |
| 6,657,124 | B2 | * | 12/2003 | Ho | 174/521 |
| 6,787,921 | B2 | * | 9/2004 | Huang | 257/778 |
| 6,916,185 | B2 | * | 7/2005 | Hedler et al. | 439/83 |
| 7,169,693 | B2 | * | 1/2007 | Akram et al. | 438/612 |
| 7,178,711 | B2 | * | 2/2007 | Wong et al. | 228/157 |
| 7,242,084 | B2 | * | 7/2007 | Wong et al. | 257/693 |
| 7,495,304 | B2 | * | 2/2009 | Lin et al. | 257/432 |
| 7,557,452 | B1 | * | 7/2009 | Williams et al. | 257/778 |
| 7,615,865 | B2 | * | 11/2009 | Kang et al. | 257/737 |
| 8,044,475 | B2 | * | 10/2011 | Lin et al. | 257/432 |
| 8,173,536 | B2 | * | 5/2012 | Cho et al. | 438/612 |
| 8,211,745 | B2 | * | 7/2012 | Eom et al. | 438/108 |
| 8,368,193 | B2 | * | 2/2013 | Lin et al. | 257/678 |
| 2005/0093153 | A1 | * | 5/2005 | Liu | 257/738 |
| 2006/0237855 | A1 | * | 10/2006 | Kroehnert et al. | 257/779 |

(Continued)

*Primary Examiner* — David Zarneke
(74) *Attorney, Agent, or Firm* — Fogg & Powers LLC

(57) ABSTRACT

A method of fabricating a semiconductor comprises forming a plurality of stud bumps in a pattern having a geometrical shape on a surface of a substrate, the pattern defining a periphery of a bonding area on the surface of the substrate, and placing a solder material in the bonding area such that the solder material is surrounded by the stud bumps. The solder material is heated to a temperature where the solder material begins to flow within the bonding area. A bonding surface of a die is pressed onto the stud bumps with a sufficient pressure to crush the stud bumps a predetermined extent such that the solder material substantially evenly spreads between the stud bumps within the bonding area. The solder material is then solidified to form a final solder area that conforms to the geometrical shape of the pattern of stud bumps.

20 Claims, 4 Drawing Sheets

(56) References Cited

U.S. PATENT DOCUMENTS

| | | | |
|---|---|---|---|
| 2007/0132097 A1* | 6/2007 | Wark et al. | 257/737 |
| 2008/0224309 A1* | 9/2008 | Hori | 257/737 |
| 2008/0290509 A1* | 11/2008 | Tan et al. | 257/737 |
| 2009/0008764 A1* | 1/2009 | Lee et al. | 257/690 |
| 2009/0014871 A1* | 1/2009 | Meyer et al. | 257/737 |
| 2009/0200663 A1* | 8/2009 | Daubenspeck et al. | 257/737 |
| 2010/0102444 A1 | 4/2010 | Khor et al. | |
| 2010/0283144 A1* | 11/2010 | Liang | 257/737 |
| 2011/0074014 A1 | 3/2011 | Pagaila et al. | |
| 2011/0210436 A1 | 9/2011 | Chow et al. | |
| 2011/0248398 A1* | 10/2011 | Parvarandeh et al. | 257/737 |
| 2012/0007237 A1* | 1/2012 | Lin et al. | 257/737 |
| 2012/0126395 A1* | 5/2012 | Lee et al. | 257/737 |
| 2012/0261820 A1* | 10/2012 | Vittu | 257/738 |
| 2012/0306072 A1* | 12/2012 | Burbidge et al. | 257/737 |
| 2013/0026620 A1* | 1/2013 | Huang et al. | 257/737 |

* cited by examiner

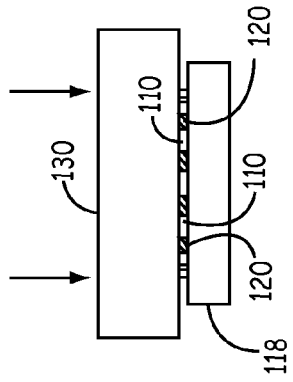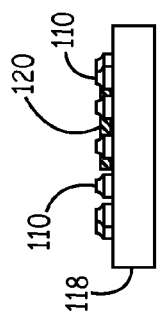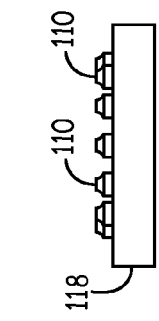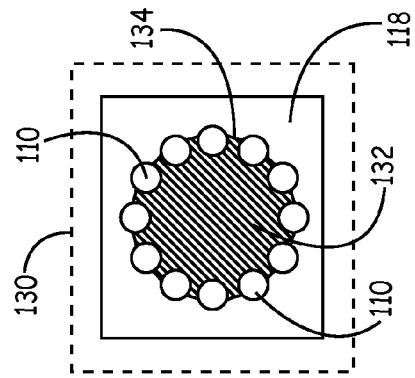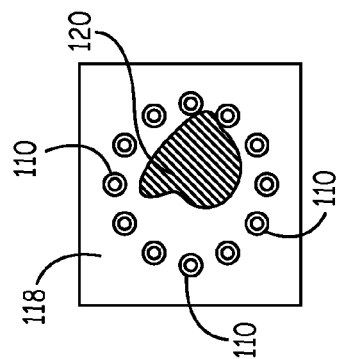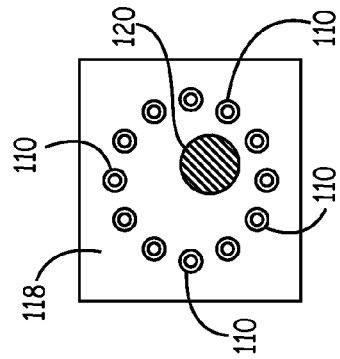

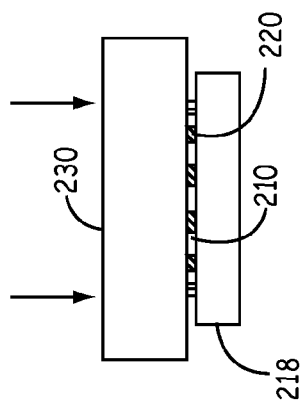 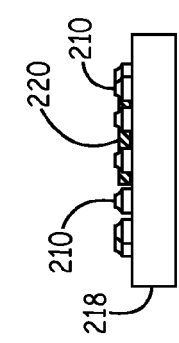 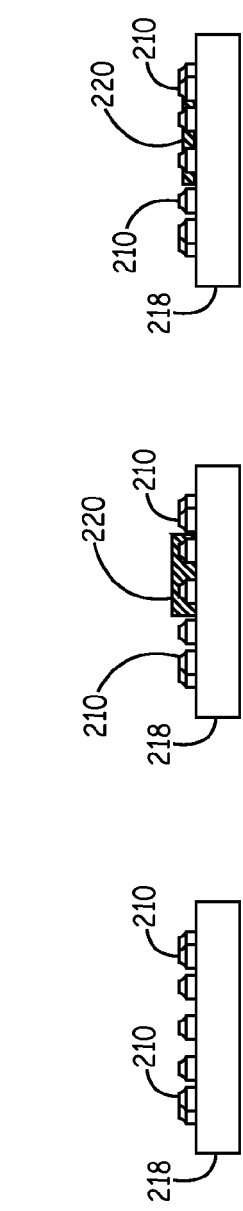 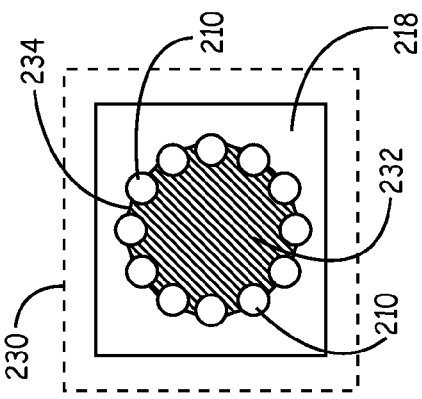 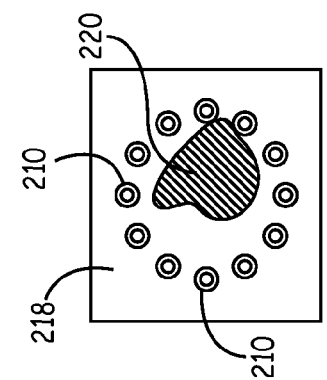 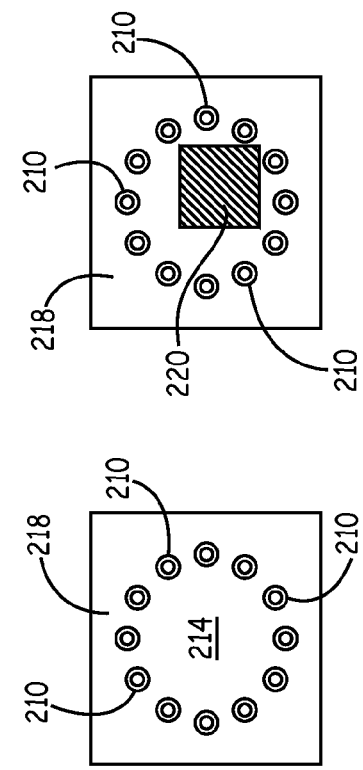

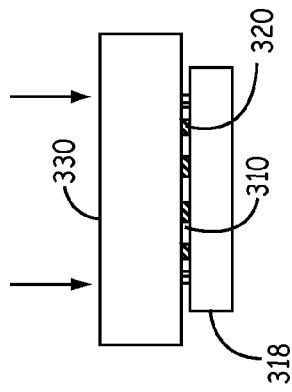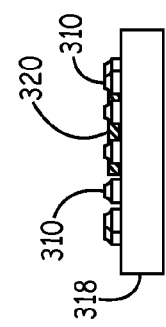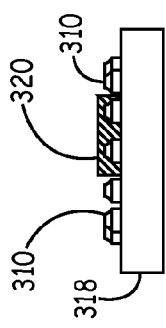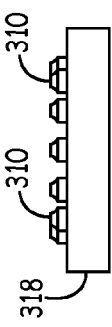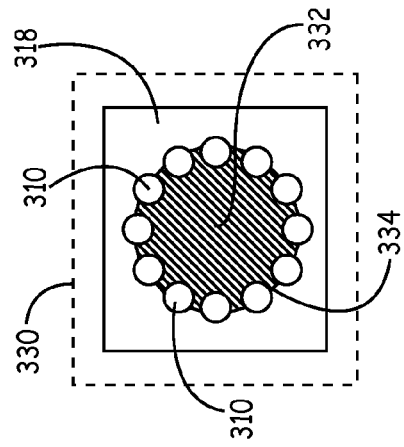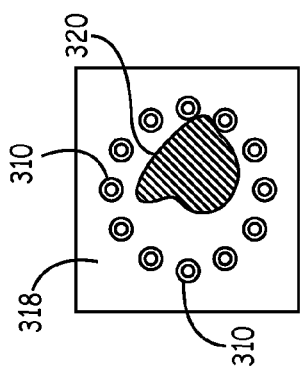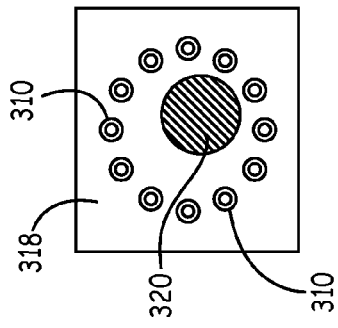

CONTROLLED AREA SOLDER BONDING FOR DIES

BACKGROUND

Controlling the area where solder flows and limiting the bonding area during die attach is very difficult. Generally, the entire die is bonded, which results in excessive stress to the die. This can be very detrimental to the performance of a die such as a micro-electro-mechanical systems (MEMS) sensor.

In general, a small solder area is all that is required to meet strength requirements for die attach. High temperature solders are usually extremely strong, and have the desirable attribute of high material elasticity, which is critical to the predictable performance of MEMS sensors. When using solders for die attach, it can be difficult to control the final area, shape, and location of the solder joint.

The most common solution for attaching die is to use a sufficient volume of solder to completely cover the back side of the die, and to overflow next to the die. While this approach can make for a solid joint, it also imparts great stress on the attached die because of the mismatch of the coefficient of thermal expansion (CTE) of the materials used, including the die material, the substrate or package to which the die is mounted, and the solder itself For example, silicon die have a CTE in the range of about 2 to 3 ppm/° C. Ceramics to which die are often mounted, such as alumina, have a higher CTE, typically around 7 ppm/° C., and printed circuit boards have a much higher CTE.

Die stress can be reduced greatly by controlling the area over which a die is soldered. A small area near the center is usually best, but this can depend on the design and purpose of the die, especially when dealing with MEMS sensors. Unfortunately, die solders are notoriously difficult to control as the solders wet unpredictably, and voiding and flow are hard to predict. Simply placing a small amount of solder near the center of a die and reflowing can result in almost any shape and thickness of final solder area, even when conditions are carefully controlled. Other methods of die attach such as pure gold stud bump (GSB) thermocompression can control the bond area, but suffer from the soft, inelastic nature of the stud bump material.

SUMMARY

A method of fabricating a semiconductor comprises forming a plurality of stud bumps in a pattern having a geometrical shape on a surface of a substrate, the pattern defining a periphery of a bonding area on the surface of the substrate, and placing a solder material in the bonding area such that the solder material is surrounded by the stud bumps. The solder material is heated to a temperature where the solder material begins to flow within the bonding area. A bonding surface of a die is pressed onto the stud bumps with a sufficient pressure to crush the stud bumps a predetermined extent such that the solder material substantially evenly spreads between the stud bumps within the bonding area. The solder material is then solidified to form a final solder area that conforms to the geometrical shape of the pattern of stud bumps.

DRAWINGS

Understanding that the drawings depict only exemplary embodiments and are not therefore to be considered limiting in scope, the exemplary embodiments will be described with additional specificity and detail through the use of the accompanying drawings, in which:

FIGS. 1A-1D are side views of a die attach process used in fabricating a semiconductor device according to one embodiment;

FIGS. 2A-2D are top views of the die attach process of FIGS. 1A-1D;

FIGS. 3A-3D are side views of a die attach process used in fabricating a semiconductor device according to another embodiment;

FIGS. 4A-4D are top views of the die attach process of FIGS. 3A-3D;

FIGS. 5A-5D are side views of a die attach process used in fabricating a semiconductor device according to a further embodiment;

FIGS. 6A-6D are top views of the die attach process of FIGS. 5A-5D;

Figure 7A:
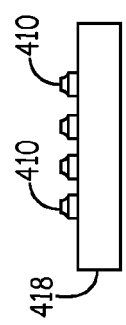
FIGS. 7A-7D are side views of a die attach process used in fabricating a semiconductor device according to an alternative embodiment.
Figure 7B:
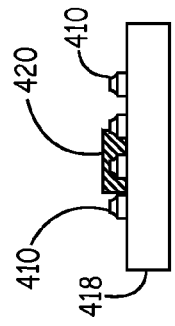

In accordance with common practice, the various described features are not drawn to scale but are drawn to emphasize specific features relevant to the exemplary embodiments.

DETAILED DESCRIPTION

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense.

A method is provided for controlling the solder bond area during die attachment to a substrate in fabricating a semiconductor device. The present method produces a controlled area solder bond on the surface of the die when attached to a substrate during packaging. The present die attach process provides more stable stress on the die such as a micro-electro-mechanical systems (MEMS) die, and thus more stable performance over temperature.

In the present technique, a plurality of stud bumps are formed in a predetermined pattern on a surface of a substrate, with the pattern defining a periphery of a bonding area on the surface of the substrate. The stud bumps form a "picket fence" around the periphery of the bonding area on the substrate. A solder material is then placed in the bonding area such that it is surrounded by the stud bumps. In exemplary embodiments, the solder material can be in the form of a small solid "preform" such as a solder sphere, or small solder particles suspended in a paste.

The solder material is heated to a temperature such that it begins to flow within the bonding area. A bonding surface of a die is then pressed onto the stud bumps with a sufficient pressure to crush the stud bumps such that the solder substantially evenly spreads between the stud bumps within the bonding area. The solder material is solidified to form a final solder area that conforms to the shape of the predetermined pattern of stud bumps.

The use of a "picket fence" of stud bumps placed near the desired edge of the solder area does not necessarily form a dam for the solder, but gives the solder something to wet to. The surface tension of the molten solder as it wets the stud bumps makes the solder cling to the stud bumps and defines the final solder area. The stud bumps can also be used to control the bondline thickness of the solder, since the stud bumps resist force in a predictable fashion. Applying a certain force to the die will crush the stud bumps to a predictable extent while spreading the solder to the stud bumps. If the pattern of stud bumps and forces used to create the bond are carefully chosen, a joint with the strength and elasticity of the high temperature solder can be formed with controlled location and size.

In a semiconductor device fabricated according to the present technique, the die is attached to the substrate at a controlled solder bond area that includes the solder material that is substantially evenly spread between the stud bumps coupled between the substrate and the die. The stud bumps are coupled in a pattern having a geometrical shape and define a periphery of the solder bond area. The solder material conforms to the geometrical shape of the pattern of the stud bumps.

Additional details of the present approach are described as follows with reference to the drawings.

FIGS. 1A-1D and 2A-2D illustrate a die attach process according to one embodiment. Initially, a plurality of stud bumps 110 are formed in a predetermined pattern having a geometrical shape around the edge of a desired bonding area 114 on a surface of a die attach substrate 118. As shown in FIG. 2A, stud bumps 110 are formed in a circular pattern to form a "picket fence" on the surface of substrate 118, although other geometric patterns may be utilized as described hereafter.

The stud bumps 110 can be formed on bonding area 114 by conventional techniques such as formation by a ball (wire) bonder. The stud bumps 110 can be composed of various metals such as gold, platinum, copper, combinations thereof, or the like.

The substrate 118 can include, for example, a ceramic material such as alumina (aluminum oxide), aluminum nitride, silicon nitride, silicon, glasses; plated metals such as nickel alloys, including Kovar™ alloy (iron-nickel-cobalt), Alloy 42 (nickel-iron alloy), or the like; or a printed circuit board (PCB).

A solder material in the form of a spherical solder preform 120, is then placed in bonding area 114 such that solder preform 120 is surrounded by stud bumps 110, as illustrated in FIGS. 1B and 2B. The solder preform 120 is heated to the solder melting temperature so that it begins to lose its shape and flow within bonding area 114, as shown in FIGS. 1C and 2C. The solder material can include, for example, eutectic alloys such as AuSn, AuSi, or AuGe, Indium alloys, or the like.

A die 130 is then pressed onto stud bumps 110 as depicted in FIG. 1D. The die 130 can include, for example, a MEMS sensor, a laser diode, an inertial sensor, or the like. Applying a certain force (such as a few newtons) to die 130 crushes stud bumps 110 a predictable extent while spreading the solder material to stud bumps 110. The surface tension of the solder material makes it cling to stud bumps 110 as the solder material wets stud bumps 110 while spreading. This defines a final solder area 132 in which the solder material is evenly spread between stud bumps 110. In this embodiment, the solder material conforms to the circular pattern of stud bumps 110 to form a circular solder bond 134, as depicted in FIG. 2D.

FIGS. 3A-3D and 4A-4D illustrate a die attach process according to another embodiment. Initially, a plurality of stud bumps 210 are formed in a predetermined pattern around the edge of a desired bonding area 214 on a surface of a die attach substrate 218. As shown in FIG. 4A, stud bumps 210 are formed in a circular pattern on the surface of substrate 218. The stud bumps 210 can be formed on bonding area 214 by conventional deposition techniques, and can be composed of various metals as described previously.

A solder material in the form of a rectangular solder preform 220, is then placed in bonding area 214 such that solder preform 220 is surrounded by stud bumps 210, as illustrated in FIGS. 3B and 4B. The solder preform 220 is then heated to the solder melting temperature so that it begins to lose its shape and flow within bonding area 214, as shown in FIGS. 3C and 4C.

A die 230, such as a MEMS sensor die, is then pressed onto stud bumps 210 as depicted in FIG. 3D. Applying a certain force to die 230 crushes stud bumps 210 while spreading the solder material towards stud bumps 210. The surface tension of solder material 220 makes it cling to stud bumps 210 as the solder material wets stud bumps 210 while spreading. This defines a final solder area 232 in which the solder material is evenly spread between stud bumps 210. In this embodiment, the solder material conforms to the circular pattern of stud bumps 210 to form a circular solder bond 234, as depicted in FIG. 4D.

FIGS. 5A-5D and 6A-6D illustrate a die attach process according to a further embodiment. A plurality of stud bumps 310 are formed in a predetermined pattern around the edge of a desired bonding area 314 on a surface of a die attach substrate 318. As shown in FIG. 6A, stud bumps 310 are formed in a circular pattern on the surface of substrate 318. The stud bumps 310 can be formed on bonding area 314 by conventional deposition techniques, and can be composed of various metals as described previously.

A solder preform 320 such as a cylindrical preform is located in bonding area 314 such it is surrounded by stud bumps 310, as illustrated in FIGS. 5B and 6B. The solder preform 320 is then heated to the solder melting temperature so that it begins to lose its shape and flow within bonding area 314, as shown in FIGS. 5C and 6C.

A die 330, such as a MEMS sensor die, is then pressed onto stud bumps 310 as depicted in FIG. 5D. Applying a certain force to die 330 crushes stud bumps 310 while spreading the solder material towards stud bumps 310. The surface tension of the solder material allows it to cling to stud bumps 310 as the solder material wets stud bumps 310. This defines a final solder area 332 in which the solder material is evenly spread between stud bumps 310. In this embodiment, the solder material conforms to the circular pattern of stud bumps 310 to form a circular solder bond 334, as depicted in FIG. 6D.

Figure 7C:
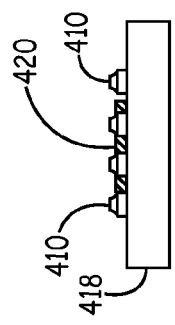
Figure 7D:
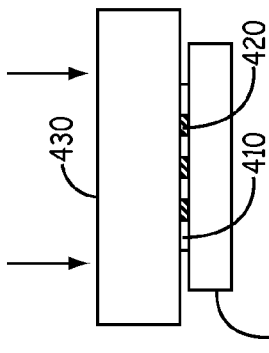
Figure 8A:
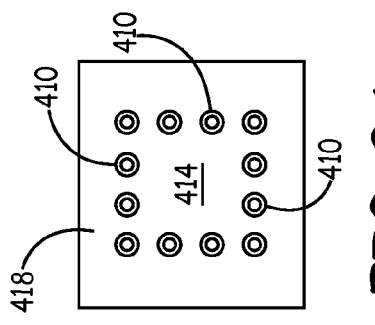
FIGS. 8A-8D are top views of the die attach process of FIGS. 7A-7D.

FIGS. 7A-7D and 8A-8D illustrate a die attach process according to an alternative embodiment. Initially, a plurality of stud bumps 410 are formed in a predetermined pattern around the edge of a desired bonding area 414 on a surface of a die attach substrate 418. As shown in FIG. 8A, stud bumps 410 are formed in a square or rectangular pattern on the surface of substrate 418. The stud bumps 410 can be formed on bonding area 414 by conventional deposition techniques, and can be composed of various metals as described previously.

Figure 8B:
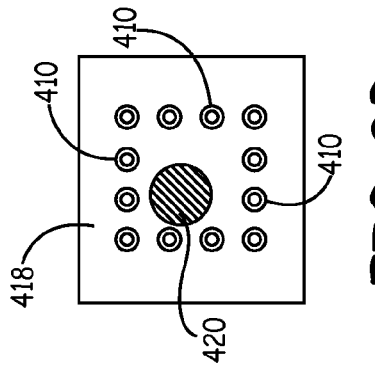
Figure 8C:
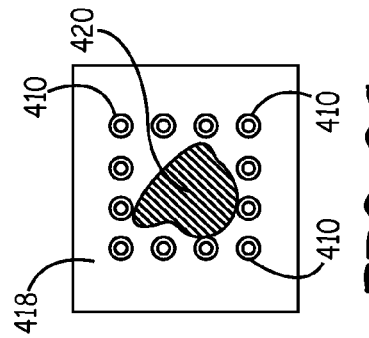

A solder preform 420 such as a cylindrical preform is then placed in bonding area 414 such that it is surrounded by stud bumps 410, as illustrated in FIGS. 8A and 8B. The preform 420 is then heated to the solder melting temperature so that it begins to lose its shape and flow within bonding area 414, as shown in FIGS. 7C and 8C.

Figure 8D:
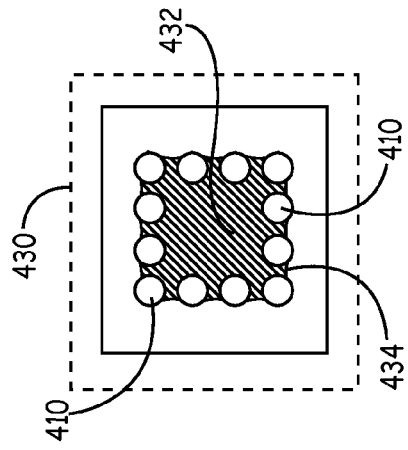

A die 430 such as a MEMS sensor die is then pressed onto stud bumps 410 as depicted in FIG. 7D. Applying a force to die 430 crushes stud bumps 410 while spreading solder material towards stud bumps 410. The surface tension of the solder material makes it cling to stud bumps 410 as the solder material wets stud bumps 410. This defines a final solder area 432 in which the solder material is evenly spread between stud bumps 410. In this embodiment, the solder material conforms to the square or rectangular shape of the pattern of stud bumps 410 to form a square or rectangular solder bond 434, as depicted in FIG. 8D.

EXAMPLE EMBODIMENTS

Example 1 includes a method of fabricating a semiconductor device, comprising forming a plurality of stud bumps in a pattern having a geometrical shape on a surface of a substrate, the pattern defining a periphery of a bonding area on the surface of the substrate; placing a solder material in the bonding area such that the solder material is surrounded by the stud bumps; heating the solder material to a temperature where the solder material begins to flow within the bonding area; pressing a bonding surface of a die onto the stud bumps with a sufficient pressure to crush the stud bumps a predetermined extent such that the solder material substantially evenly spreads between the stud bumps within the bonding area; and solidifying the solder material to form a final solder area that conforms to the geometrical shape of the pattern of stud bumps.

Example 2 includes the method of Example 1, wherein the stud bumps are formed in a circular pattern on the surface of substrate.

Example 3 includes the method of Example 1, wherein the stud bumps are formed in a rectangular pattern on the surface of substrate.

Example 4 includes the method of any of Examples 1-3, wherein the stud bumps comprise gold, platinum, copper, or combinations thereof Example 5 includes the method of any of Examples 1-4, wherein the solder material is a spherical shaped preform.

Example 6 includes the method of any of Examples 1-4, wherein the solder material is a rectangular shaped preform.

Example 7 includes the method of any of Examples 1-4, wherein the solder material is a cylindrical shaped preform.

Example 8 includes the method of any of Examples 1-7, wherein the die comprises a micro-electro-mechanical systems (MEMS) sensor, an inertial sensor, or a laser diode.

Example 9 includes the method of any of Examples 1-8, wherein the substrate comprises a ceramic material, a plated metal, or a printed circuit board.

Example 10 includes the method of any of Examples 1-8, wherein the substrate comprises aluminum oxide, aluminum nitride, silicon nitride, silicon, or glass.

Example 11 includes a semiconductor device, comprising a substrate having an upper surface; a die attached to the substrate at a controlled solder bond area that includes a solder material that is substantially evenly spread between a plurality of stud bumps coupled between the substrate and the die; wherein the stud bumps are coupled in a pattern having a geometrical shape and define a periphery of the solder bond area; wherein the solder material conforms to the geometrical shape of the pattern of the stud bumps.

Example 12 includes the semiconductor device of Example 11, wherein the stud bumps are coupled in a circular pattern.

Example 13 includes the semiconductor device of Example 11, wherein the stud bumps are coupled in a rectangular pattern.

Example 14 includes the semiconductor device of any of Examples 11-13, wherein the stud bumps comprise gold, platinum, copper, or combinations thereof Example 15 includes the semiconductor device of any of Examples 11-14, wherein the die comprises a MEMS sensor.

Example 16 includes the semiconductor device of any of Examples 11-15, wherein the die comprises an inertial sensor.

Example 17 includes the semiconductor device of any of Examples 11-14, wherein the die comprises a laser diode.

Example 18 includes the semiconductor device of any of Examples 11-17, wherein the substrate comprises a ceramic material, or a plated metal.

Example 19 includes the semiconductor device of any of Examples 11-17, wherein the substrate comprises aluminum oxide, aluminum nitride, silicon nitride, silicon, or glass.

Example 20 includes the semiconductor device of any of Examples 11-17, wherein the substrate comprises a printed circuit board.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A method of fabricating a semiconductor device, comprising:
    forming a plurality of stud bumps in a pattern having a geometrical shape on a surface of a substrate, the pattern defining a periphery of a bonding area on the surface of the substrate;
    placing a solder material in the bonding area such that the solder material is surrounded by the stud bumps;
    heating the solder material to a temperature where the solder material begins to flow within the bonding area;
    pressing a bonding surface of a die onto the stud bumps with a sufficient pressure to crush the stud bumps a predetermined extent such that the solder material substantially evenly spreads between the stud bumps within the bonding area; and
    solidifying the solder material to form a final solder area that conforms to the geometrical shape of the pattern of stud bumps.

2. The method of claim 1, wherein the stud bumps are formed in a circular pattern on the surface of substrate.

3. The method of claim 1, wherein the stud bumps are formed in a rectangular pattern on the surface of substrate.

4. The method of claim 1, wherein the stud bumps comprise gold, platinum, copper, or combinations thereof.

5. The method of claim 1, wherein the solder material is a spherical shaped preform.

6. The method of claim 1, wherein the solder material is a rectangular shaped preform.

7. The method of claim 1, wherein the solder material is a cylindrical shaped preform.

8. The method of claim 1, wherein the die comprises a micro-electro-mechanical systems (MEMS) sensor, an inertial sensor, or a laser diode.

9. The method of claim 1, wherein the substrate comprises a ceramic material, a plated metal, or a printed circuit board.

10. The method of claim 1, wherein the substrate comprises aluminum oxide, aluminum nitride, silicon nitride, silicon, or glass.

11. A semiconductor device, comprising:
    a substrate having an upper surface; and
    a die attached to the substrate at a controlled solder bond area that includes a solder material that is substantially evenly spread between a plurality of stud bumps coupled between the substrate and the die;
    wherein the stud bumps are coupled in a pattern having a geometrical shape and define a periphery of the solder bond area;

wherein the solder material conforms to the geometrical shape of the pattern of the stud bumps.

12. The semiconductor device of claim 11, wherein the stud bumps are coupled in a circular pattern.

13. The semiconductor device of claim 11, wherein the stud bumps are coupled in a rectangular pattern.

14. The semiconductor device of claim 11, wherein the stud bumps comprise gold, platinum, copper, or combinations thereof.

15. The semiconductor device of claim 11, wherein the die comprises a MEMS sensor.

16. The semiconductor device of claim 11, wherein the die comprises an inertial sensor.

17. The semiconductor device of claim 11, wherein the die comprises a laser diode.

18. The semiconductor device of claim 11, wherein the substrate comprises a ceramic material, or a plated metal.

19. The semiconductor device of claim 11, wherein the substrate comprises aluminum oxide, aluminum nitride, silicon nitride, silicon, or glass.

20. The semiconductor device of claim 11, wherein the substrate comprises a printed circuit board.

* * * * *